(12) United States Patent
Basceri et al.

(10) Patent No.: US 6,534,357 B1
(45) Date of Patent: Mar. 18, 2003

(54) METHODS FOR FORMING CONDUCTIVE STRUCTURES AND STRUCTURES REGARDING SAME

(75) Inventors: Cem Basceri, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/711,206

(22) Filed: Nov. 9, 2000

(51) Int. Cl.[7] .......................................... H01L 21/8242
(52) U.S. Cl. ..................... 438/239; 438/253; 438/250; 438/396; 438/648; 438/650; 257/748
(58) Field of Search ................... 438/239, 253, 438/256, 761, 650, 648, 396, 386; 257/330, 332, 333, 397, 388

(56) References Cited

U.S. PATENT DOCUMENTS

| | | |
|---|---|---|
| 5,270,241 A | 12/1993 | Dennison et al. |
| 5,555,486 A | 9/1996 | Kingon et al. |
| 6,333,537 B1 * | 12/2001 | Arita ........................... 257/310 |
| 6,337,239 B1 * | 1/2002 | Dehm et al. ................. 438/240 |

OTHER PUBLICATIONS

Dong–Soo Yoon, Jun Cheol Bae, Sung–Man Lee, and Hong Koo Baik, Electrochem. and Solid–State Lett. 3(8), 2000, pp. 373–376.*

* cited by examiner

Primary Examiner—Tom Thomas
Assistant Examiner—Thomas J. Magee
(74) Attorney, Agent, or Firm—Mueting, Raasch & Gebhardt, P.A.

(57) ABSTRACT

A method for forming a metal/metal oxide structure that includes forming metal oxide regions, e.g., ruthenium oxide regions, at grain boundaries of a metal layer, e.g., platinum. Preferably, the metal oxide regions are formed by diffusion of oxygen through grain boundaries of the metal layer, e.g., platinum, to oxidize a metal layer thereon, e.g, ruthenium layer. The structure is particularly advantageous for use in capacitor structures and memory devices, such as dynamic random access memory (DRAM) devices.

45 Claims, 4 Drawing Sheets

METHODS FOR FORMING CONDUCTIVE STRUCTURES AND STRUCTURES REGARDING SAME

FIELD OF THE INVENTION

The present invention relates to the preparation of semiconductor device structures. More particularly, the present invention pertains to methods of forming conductive structures such as electrode structures and the structures resulting therefrom.

BACKGROUND OF THE INVENTION

In the fabrication of integrated circuits, various conductive layers are used. For example, during the formation of semiconductor devices, such as dynamic random access memories (DRAMs), or any other types of memory devices, conductive materials are used in the formation of storage cell capacitors, and also may be used in interconnection structures, e.g., conductive layers in contact holes, vias, etc. For example, in the fabrication of integrated circuits including capacitor structures, conductive layers are used for capacitor electrodes. Memory circuits, such as DRAMs and the like, use conductive structures to form opposing electrodes of storage cell capacitors.

As memory devices become more dense, it is necessary to decrease the size of circuit components forming such devices. One way to retain storage capacity of storage cell capacitors of the memory devices, and at the same time decrease the memory device size, is to increase the dielectric constant of the dielectric layer of a storage cell capacitor. Therefore, high dielectric constant materials are used in such applications and interposed between two electrodes. One or more layers of various conductive materials may be used as the electrode material. Generally, one or more of the layers of conductive material used for the electrodes (particularly the bottom electrode of the cell capacitor) has certain diffusion barrier properties, e.g., silicon or oxygen diffusion barrier properties. Such properties are particularly required when high dielectric constant materials are used for the dielectric layer of the storage cell capacitor because of the processes used in forming such high dielectric constant materials, e.g., deposition of high dielectric constant materials usually occurs at high temperatures (generally, greater than about 500° C.) in an oxygen-containing atmosphere.

Various metals and metallic compounds, for example, metals such as platinum, and conductive metal oxides such as ruthenium oxide, have been proposed as the electrode materials or at least one of the layers of an electrode stack for use with high dielectric constant materials. However, electrodes generally need to be constructed such that they do not diminish the beneficial properties of the high dielectric constant materials. For example, for platinum to function well as a bottom electrode or as one of the layers of an electrode stack, an effective barrier to the diffusion of silicon from the substrate or other silicon-containing region to the top of the electrode needs to be provided. This is typically required since silicon at the surface of the electrode stack will tend to be oxidized during the oxygen anneal of the high dielectric constant materials and/or during deposition of oxide dielectrics, e.g., $Ta_2O_5$ or $BaSrTiO_3$, which will result in a decreased series capacitance, thus degrading the storage capacity of the capacitor. In addition, oxygen diffusion through the platinum electrode layer during high temperature oxidizing processes, e.g., $BaSrTiO_3$ deposition processes, needs to be prevented. Such oxygen diffusion through the platinum occurs generally through the platinum grain boundaries.

Further, during high temperature processing of devices (e.g., high dielectric constant material formation processes) that include platinum conductive layers, stress occurs in the platinum layer. Such stress may result in the formation of a discontinuous platinum layer, such as in the form of platinum islands, which are undesirable. The formation of such platinum islands may result in films that are unstable for use as capacitor electrodes.

In addition to the use of high dielectric constant materials for capacitor structures, it is desirable to take other steps to increase or preserve capacitance without increasing the occupied area. For example, electrode surfaces may be roughened to increase the effective surface area of electrodes without increasing the area occupied by the capacitor.

One method for providing a roughened surface for a plate of a storage cell capacitor is to form the plate of hemispherical grain polysilicon (HSG), possibly with an overlying metal layer. The hemispherical grains of HSG enhance the surface area of the plate without increasing its occupied area.

However, HSG presents difficulties in fabrication because of the formation of silicon dioxide on and near the HSG. A silicon dioxide layer may form on the HSG, particularly during deposition of the capacitor's dielectric layer. Even with an intervening metal layer present, oxygen from the deposition of the dielectric layer can diffuse through the metal layer, forming silicon dioxide at the polysilicon surface. Silicon diffusion through the metal layer may also produce an undesirable silicon dioxide layer between the metal and the dielectric layers.

To avoid these negative effects caused by formation of silicon dioxide, a diffusion barrier layer may be employed between the HSG and the metal layer. But, in a typical capacitor geometry, the greater the total number of layers, the larger the required minimum area occupied by the capacitor. Further, the upper surface of each additional layer deposited over the HSG tends to be smoother than the underlying surface, reducing the increased surface area provided by the HSG.

SUMMARY OF THE INVENTION

The present invention provides a stable metal/metal oxide structure (e.g., a platinum/ruthenium oxide composite structure) for use in integrated circuits, e.g., capacitor electrodes. Such a metal/metal oxide composite structure is especially beneficial for use with high permittivity materials, e.g., high dielectric constant materials used with capacitor structures. Further, the present invention also provides for an enhanced surface area electrode.

A method for use in fabrication of integrated circuits according to the present invention includes providing a substrate assembly including an oxygen-containing surface portion and forming a first metal layer on at least a portion of the oxygen-containing surface portion. A second metal layer is formed on at least a portion of the first metal layer and an oxidation diffusion barrier layer is provided on at least a portion of the second metal layer. One or more regions of the second metal layer are oxidized to form metal oxide regions corresponding to one or more grain boundaries of the first metal layer by thermally treating the substrate assembly having the first metal layer, second metal layer, and oxidation diffusion barrier layer formed thereon. The oxidation diffusion barrier layer and unoxidized portions of the second metal layer are then removed.

In another method for use in fabrication of integrated circuits according to the present invention, a substrate assembly including an oxygen-containing surface portion is provided and a first metal layer (e.g., platinum) is formed on at least a portion of the oxygen-containing surface portion. The first metal layer has grain boundaries extending therethrough. A second metal layer (e.g., ruthenium) is formed on at least a portion of the first metal layer. Metal oxide regions are formed on at least portions of the first metal layer at one or more grain boundaries thereof through selective oxidation of the second metal layer by diffusion of oxygen from the oxygen-containing surface portion through the one or more grain boundaries of the first metal layer. For example, the metal oxide regions may be formed by providing an oxidation diffusion barrier layer on at least a portion of the second metal layer, thermally treating the substrate assembly having the first metal layer, second metal layer, and oxidation diffusion barrier layer formed thereon to selectively oxidize one or more regions of the second metal layer at the one or more grain boundaries of the first metal layer resulting in the one or more metal oxide regions and unoxidized portions of the second metal layer therebetween, and then removing the oxidation diffusion barrier layer and the unoxidized portions of the second metal layer.

In various embodiments of the methods, the thermal treatment may be performed at a temperature greater than 300° C., the thermal treatment may be performed in a non-oxidizing atmosphere, the first metal layer may be formed of at least one metal selected from the group of platinum, palladium, rhodium, and iridium (preferably platinum), the second metal layer may be formed of at least one metal selected from the group of ruthenium, osmium, rhodium, iridium, and cerium (preferably ruthenium), the oxidation diffusion barrier layer may be formed of at least one of silicon nitride, silicon oxynitride, and aluminum oxide (preferably silicon nitride), and the unoxidized portions of the second metal layer may be removed using at least one of a wet etch and a dry etch. Yet further, in other embodiments, the methods above may be used in the formation of capacitors, e.g., electrodes thereof.

A semiconductor structure according to the present invention includes a substrate assembly including an oxygen-containing surface portion and a first metal layer (e.g., platinum) on at least a portion of the oxygen-containing surface portion. One or more metal oxide regions (e.g., ruthenium oxide) are formed from a second metal layer on at least portions of the first metal layer at one or more grain boundaries thereof.

In one embodiment of the structure, the structure includes an oxidation diffusion barrier layer on at least a portion of the second metal layer over at least the one or more metal oxide regions and unoxidized portions of the second metal layer between the one or more metal oxide regions.

In various other embodiments of the structure, the oxidation diffusion barrier layer may be formed of at least one of silicon nitride, silicon oxynitride, and aluminum oxide, the first metal layer may be formed of at least one metal selected from the group of platinum, palladium, rhodium, and iridium (preferably platinum), and the second metal layer may be formed of at least one metal selected from the group of ruthenium, osmium, rhodium, iridium, and cerium (preferably ruthenium).

Further, in other embodiments of the structure, the structure may be used as part of or in the formation of a capacitor structure and/or a memory cell structure.

DETAILED DESCRIPTION OF THE EMBODIMENTS

The present invention shall be generally described with reference to FIGS. 1–2. Thereafter, other embodiments, illustrations, and applications of the present invention shall be described with reference to FIGS. 3–4.

Figure 1:
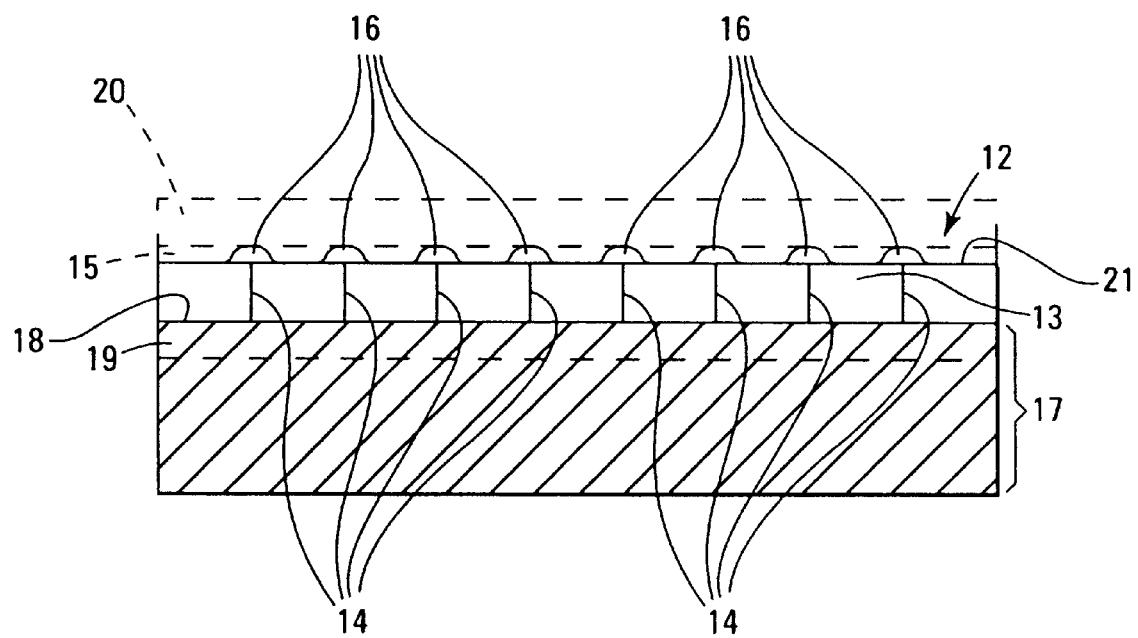
FIG. 1 is a cross-sectional schematic of one embodiment of a substrate assembly having a composite metal/metal oxide conductive structure formed thereon in accordance with the present invention.

FIG. 1 illustrates a substrate assembly 17 and a metal/metal oxide composite structure 12 formed according to the present invention on a surface 18 of the substrate assembly 17, e.g., an oxygen-containing surface portion. FIG. 1 is illustrative of the use of a composite metal/metal oxide structure 12 for any application such as those requiring the benefits provided thereby as further described below. For example, the application may be a capacitor electrode application. As such an electrode, the composite metal/metal oxide structure 12 may be used to prevent oxygen diffusion through the electrode of the capacitor, provide an enhanced surface area, etc. Further, for example, the composite metal/metal oxide structure 12 may be used in the formation of storage cell capacitors for use in semiconductor devices, e.g., memory devices. As further described herein, the structure 12 may be used within a stack of layers forming an electrode of a capacitor, or may be used as the capacitor electrode by itself. One skilled in the art will recognize that various semiconductor processes and structures for various devices, e.g., CMOS devices, memory devices, etc., would benefit from the characteristics of the composite metal/metal oxide structure 12 of the present invention, and in no manner is the present invention limited to the illustrative embodiments described herein.

As used in this application, "substrate assembly" refers to either a semiconductor substrate, such as the base semiconductor layer, e.g., the lowest layer of a silicon material in a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, or various structures or features and openings, such as vias, contact openings, high aspect ratio openings, etc.

According to the present invention, the substrate assembly 17 includes at least a portion thereof that is an oxygen-containing surface portion upon which at least a portion of the composite metal/metal oxide structure 12 is formed. Such an oxygen-containing surface portion is shown as the dashed line surface portion 19. The oxygen-containing surface portion 19 may be, for example, formed of any oxygen-containing material such as any oxide material. For example, the oxide material may include borophosphosilicate glass (BPSG), phosphosilicate glass (PSG), tetraethylorthosilicate glass (TEOS), ozone-enhanced TEOS, or any other oxygen-containing material.

The composite metal/metal oxide structure 12 includes a first metal layer 13 including grain boundaries 14 thereof illustratively shown within first metal layer 13. Further, the composite structure 12 includes metal oxide regions 16 formed on at least portions of the first metal layer 13 at grain boundaries 14 thereof. The metal oxide regions 16 are formed, as described further below with reference to FIG. 2, through selective oxidation of a second metal layer 15 (as shown by dashed line 15 in FIG. 1) formed on the first metal layer 13. The selective oxidation of the second metal layer 15 is performed by diffusion of oxygen from the oxygen-containing surface portion 19 of substrate assembly 17 through the grain boundaries 14 of the first metal layer 13.

Preferably, the metal oxide regions 16 are formed on at least portions of the first metal layer 13 at one or more grain boundaries 14 thereof by providing an oxygen diffusion barrier layer 20 (also shown in dashed line form in FIG. 1) on at least a portion of the second metal layer 15 which is to be selectively oxidized. Upon thermal treatment of the substrate assembly 17 having the first metal layer 13, the second metal layer 15, and the oxygen diffusion barrier layer 20 formed thereon, selective oxidation of the one or more regions of the second metal layer 15 occurs at one or more grain boundaries 14 of the first metal layer 13 resulting in the metal oxide regions 16 and unoxidized portions of the second metal layer 15 generally between the metal oxide regions 16 formed at the grain boundaries 14. The composite metal/metal oxide structure 12 is thereafter formed by removing the oxidation diffusion barrier layer 20 and the unoxidized portions of the second metal layer 15 resulting in the non-dashed composite structure 12 shown in FIG. 1.

Preferably, the first metal layer 13 is formed of at least one metal selected from a group of platinum, palladium, rhodium, and iridium. More preferably, as shall be described further below with reference to FIG. 2, the first metal layer is formed of at least platinum.

Preferably, the second metal layer 15 is formed of at least one metal selected from a group of ruthenium, osmium, rhodium, iridium, and cerium. More preferably, the second metal layer 15 is formed of at least ruthenium. As such, with a second metal layer 15 formed of such materials, the metal oxide regions 16 will include, for example, ruthenium oxide, osmium oxide, etc. depending upon the material used.

Preferably, the oxygen diffusion barrier layer 20 is a layer that is less permeable to oxygen than the oxygen-containing surface portion 19. As such, oxygen diffusing through the grain boundaries 14 of the first metal layer 13 during thermal treatment will oxidize localized regions about the grain boundaries 14 at the surface 21 of the first metal layer 13 to form the metal oxide regions 16. For example, the oxidation diffusion barrier layer 20 may be formed of at least one of silicon nitride, silicon oxynitride, and aluminum oxide. Preferably, a silicon nitride layer 20 is used to passivate the underlying structure.

The first and second metal layers 13, 15 are preferably formed by chemical vapor deposition processes (CVD) as known to those skilled in the art. However, such layers may be formed by atomic layer deposition (ALD), evaporation, sputtering, or any other method suitable to form such layers. Preferably, however, CVD is used to obtain uniformity so as to provide enhanced step coverage. The present invention, however, is not limited to any particular method of forming such layers.

Preferably, the first metal layer 13 is formed to a thickness of about 20 Å to about 1000 Å. More preferably, the first metal layer 13 has a thickness in the range of about 50 Å to about 200 Å. In addition, the second metal layer 15 is formed to a thickness of about 20 Å to about 1000 Å. More preferably, the second metal layer 15 has a thickness of about 50 Å to about 200 Å. Yet still further, the oxidation diffusion barrier layer 20 is preferably formed to a thickness of about 100 Å to about 500 Å.

The method of forming a composite metal/metal oxide structure 12 according to the present invention will be better understood from the more detailed description provided with reference to FIG. 2. However, for clarity and simplicity, and with reference to preferred materials, the method of forming the metal/metal oxide structure shall be described with reference to FIG. 2 wherein a composite platinum/ruthenium oxide electrode structure 38 as shown in FIG. 2D (e.g., where the first metal layer is platinum and the second metal layer is ruthenium) is formed according to the present invention. However, one skilled in the art will recognize that such processing is applicable to the other materials described herein as well. Further, the method as described with reference to FIGS. 2A–2E shall be described with respect to the composite platinum/ruthenium oxide structure 38 being used as a bottom electrode of a capacitor structure 50, as shown in FIG. 2E. However, although the present invention is particularly advantageous for use of the composite structure as a bottom electrode, the present invention is not limited to this application only and may well be used for any other applications wherein a conductive structure is required.

Figure 2A:
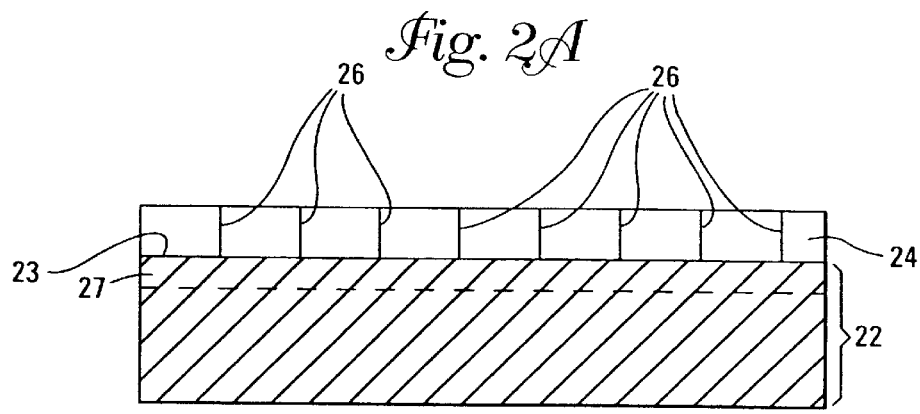
FIGS. 2A–2E show one illustrative embodiment of a method for forming a composite metal/metal oxide electrode for use in an illustrative capacitor application, e.g., a platinum/ruthenium oxide composite electrode used in combination with high dielectric constant materials.

In accordance with the present invention, FIG. 2A shows a substrate assembly 22 including an oxygen-containing surface portion 27. As described previously herein, the oxygen-containing surface portion 27 may be formed of any oxygen-containing material such as BPSG. As shown in FIG. 2A, a platinum layer 24 is formed on surface 23 of the substrate assembly 22. Preferably, the platinum layer 24 is formed by CVD. As CVD of platinum is known in the art, further details with respect to the formation thereof shall not be provided in any further detail. For example, an oxidizing ambient in the CVD of platinum may be used (e.g., an $O_2$ or $N_2O$ ambient environment). With control of the oxidizing environment, excess oxygen can be added during deposition of the platinum to enhance oxidation of the ruthenium during the subsequent thermal treatment.

After formation of the platinum layer 24 on surface 23 of the substrate assembly 22, a ruthenium layer 28 is formed on the platinum layer 24. The ruthenium layer 24 is also preferably deposited by CVD. Again, as CVD of ruthenium is known in the art, further details with respect thereto shall not be further provided.

The deposited metal layers 24, 28 each have respective grain boundaries 26, 29 therein. As illustratively shown in FIG. 2B, platinum layer 24 has grain boundaries 26 extending therethrough from the surface 23 of substrate assembly 22 on which it is formed to the upper surface 31 of the platinum layer 24. Likewise, ruthenium layer 28 includes grain boundaries 29 extending from surface 31 of the platinum layer 24 on which it is formed through the upper surface 33 thereof.

Figure 2B:
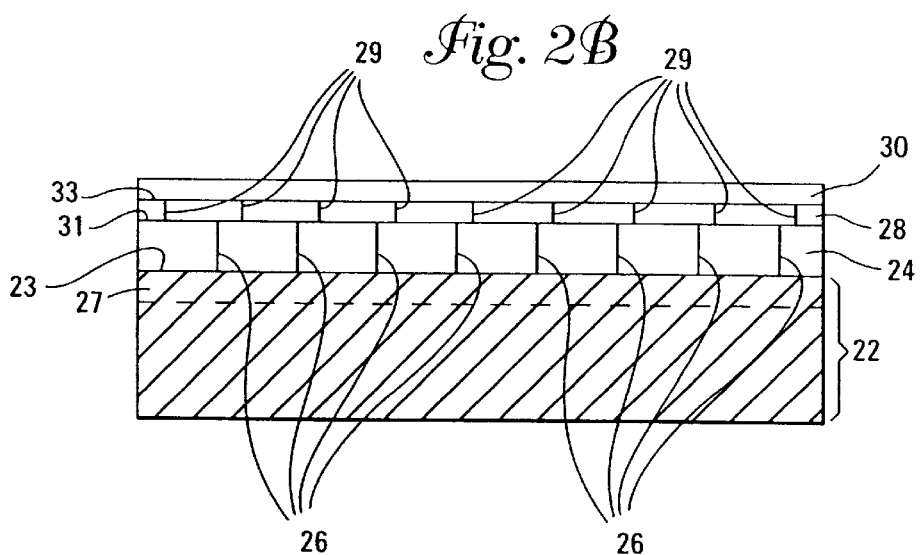

Further, as shown in FIG. 2B, a silicon nitride layer 30 is formed on the ruthenium layer 28. Formation of the silicon nitride as the oxidation diffusion barrier layer may be attained by any suitable method as known to those skilled in the art.

One skilled in the art will recognize that the thickness of layers will vary depending on various factors, including but not limited to the application where the structure is to be used. Generally, however, preferably, the layers are formed to thicknesses in the ranges as described with reference to FIG. 1. The ruthenium layer 28 preferably has a thickness such that it is entirely oxidized in the local region about the grain boundaries 26 through the surface 33 thereof during the thermal treatment of the structure.

Figure 2C:
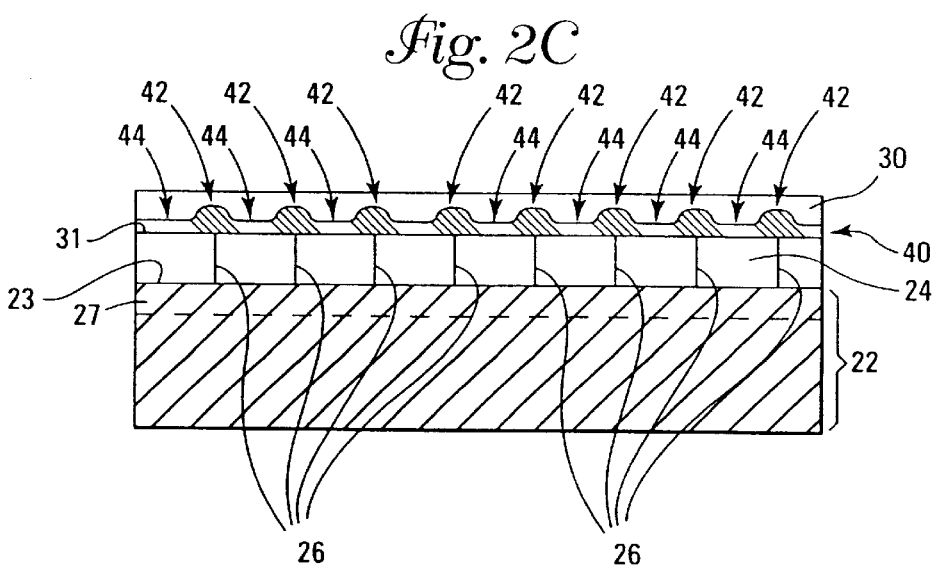

With the platinum layer 24, the ruthenium layer 28, and the silicon nitride layer 30 formed on the oxygen-containing surface portion 27 of substrate assembly 22, a thermal treatment is performed. The resultant structure following the thermal treatment is shown in FIG. 2C. Preferably, the stack of layers is annealed at elevated temperatures under vacuum or reducing conditions to allow oxygen diffusion from the oxygen-containing surface portion 27 through grain boundaries 26 of the platinum layer 24. As a result of such oxygen diffusion through the grain boundaries 26 of the platinum layer 24, selective oxidation of localized regions of the ruthenium layer 28 occurs at the grain boundaries 26 of the platinum layer 24 on surface 31 thereof. As shown in FIG. 2C, such oxidation results in a ruthenium/ruthenium oxide layer 40 including ruthenium oxide regions 42 formed on surface 31 of the platinum layer 24 at the grain boundaries 26 and unoxidized portions 44 of the ruthenium layer located between such ruthenium oxide regions 42 at portions of surface 31 that are relatively distant from the grain boundaries 26, e.g., outside of the local regions about the grain boundaries 26.

Preferably, the anneal of the stack of layers on substrate assembly 22 is performed at temperatures greater than about 300° C. More preferably, such temperatures are greater than about 500° C. Also preferably, the anneal is performed in a non-oxidizing atmosphere, e.g, a nitrogen atmosphere.

The anneal preferably is a furnace anneal performed at such elevated temperatures. However, an anneal may be performed using rapid thermal processing (RTP) techniques and further may be performed by a combination of steps at varied temperatures. However, preferably, at least one anneal temperature is in the ranges described above.

Figure 2D:
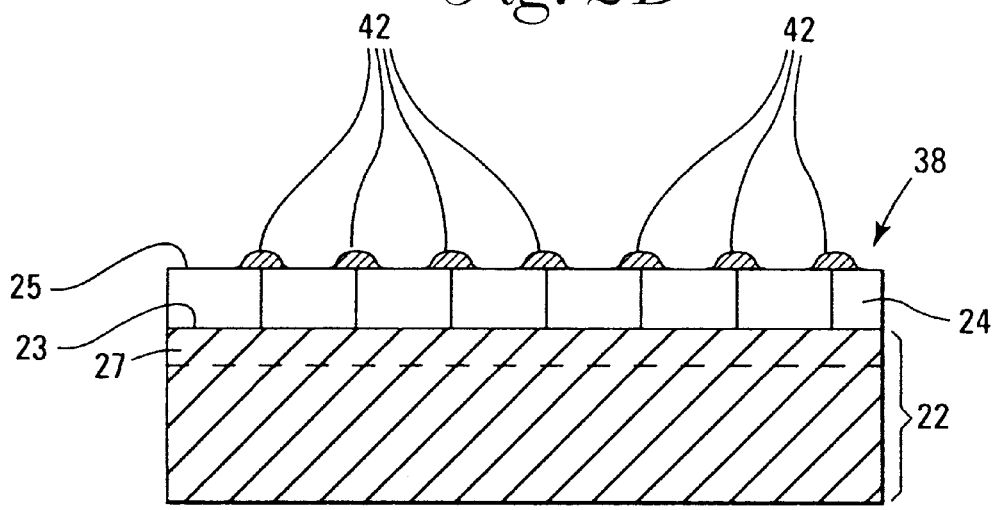

With the local ruthenium oxide regions 42 formed at the grain boundaries 26 of platinum layer 24, the composite platinum/ruthenium oxide structure 38 as shown in FIG. 2D may be formed upon the removal of the silicon nitride layer 30 and the unoxidized portions 44 of the ruthenium/ruthenium oxide layer 40. The removal of the silicon nitride layer 30 may be accomplished by any suitable process. For example, silicon nitride may be removed by various fluorine-containing etch gases such as $CF_4/O_2$, $CF_4/H_2$, $C_2F_6$, etc., in a dry etch or plasma etch process.

The ruthenium/ruthenium oxide layer 40 including both unoxidized ruthenium portions 44 and ruthenium oxide regions 42 is processed to selectively remove the unoxidized ruthenium portions 44 relative to the ruthenium oxide regions 42, and desirably relative to the underlying platinum layer 24. Such removal of the unoxidized ruthenium portions 44 may be accomplished using any suitable selective wet etch process or dry etch process. As one specific example of a wet etch process used to selectively remove the unoxidized ruthenium portions 44, a wet etchant comprising ceric ammonium nitrate and acetic acid may be used.

One skilled in the art will recognize that any processes that remove the unoxidized ruthenium portions 44 preferentially over the ruthenium oxide regions 42 may be used according to the present invention. The remaining ruthenium oxide regions 42 constitute, together with the underlying platinum layer 24, an enhanced surface area layer compatible with high dielectric constant materials.

Figure 2E:
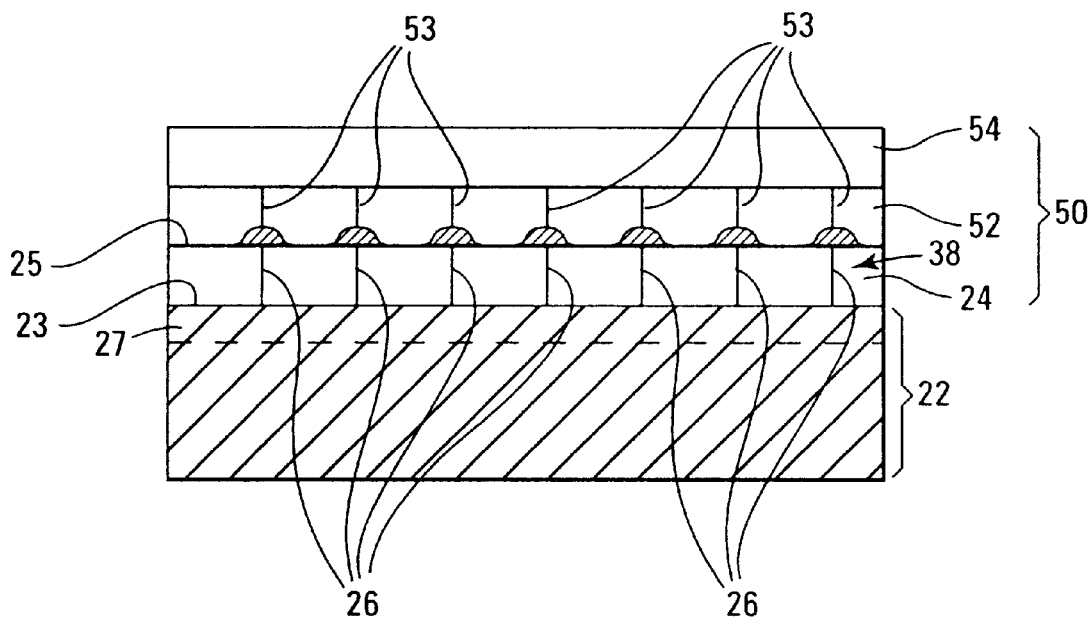

As shown in FIG. 2E, capacitor structure 50 is completed by the formation of dielectric material 52 on the platinum/ruthenium oxide composite electrode 38 and formation of a second electrode or top electrode 54 formed on at least a portion of the dielectric layer 52. The dielectric material 52 is preferably a high dielectric constant material interposed between the composite electrode 38 and second electrode 54. As used herein, a high dielectric constant material preferably has a dielectric constant of at least 9, and more preferably a dielectric constant of at least 20. For example, the high dielectric constant material may be any suitable material having a desirable dielectric constant, such as $Ta_2O_5$, $Ba_xSr_{(1-x)}TiO_3$[BST], $BaTiO_3$, $SrTiO_3$, $PbTiO_3$, $Pb(Zr,Ti)O_3$ [PZT], $(Pb,La)(ZrTi)O_3$ [PLZT], $(Pb,La)TiO_3$ [PLT], $KNO_3$, $LiNbO_3$, $ZrO_2$, $HfO_2$, Zr-silicate, Hf-silicate, and $Al_2O_3$.

With use of the high dielectric constant material 52, diffusion barrier properties of electrodes is particularly important. For example, to function well as a bottom electrode of a capacitor structure, the electrode layer or stack of layers must act as an effective barrier to the diffusion of silicon and oxygen, particularly due to the processes used to form the high dielectric constant materials. Such diffusion barrier properties are required when the substrate assembly 22 includes a silicon-containing surface upon which the capacitor is formed, e.g., polysilicon, silicon substrate material, n-doped silicon, p-doped silicon, etc., since oxidation of the diffused silicon may result in degraded capacitance, e.g., capacitance for a memory device. In addition, the electrode stack must act as an oxygen barrier, for example, to prevent an underlying silicon-containing surface from oxidizing. The formation of the composite structure 38 according to the present invention provides such barrier properties.

The second electrode or top electrode 54 may be formed of any suitable conductive material. For example, the electrode may include a stack of layers or a single layer. The electrode 54 may be formed of any suitable material such as those typically used in the formation of electrodes such as tungsten nitride, titanium nitride, tantalum nitride, ruthenium, rhodium, iridium, ruthenium oxide, iridium oxide, platinum, palladium, any combination thereof, or any other conductive material typically used as an electrode or electrode layer of a storage cell capacitor.

As shown in FIG. 2E, grain boundaries 53 of the dielectric material 52 match the grain boundaries 26 of the platinum layer 24. In other words, such grain boundaries of the high dielectric layer 52 and of the composite structure 38 are aligned. However, as shown in FIG. 3, such grain boundaries may be mismatched between the dielectric material and platinum layer.

Figure 3:
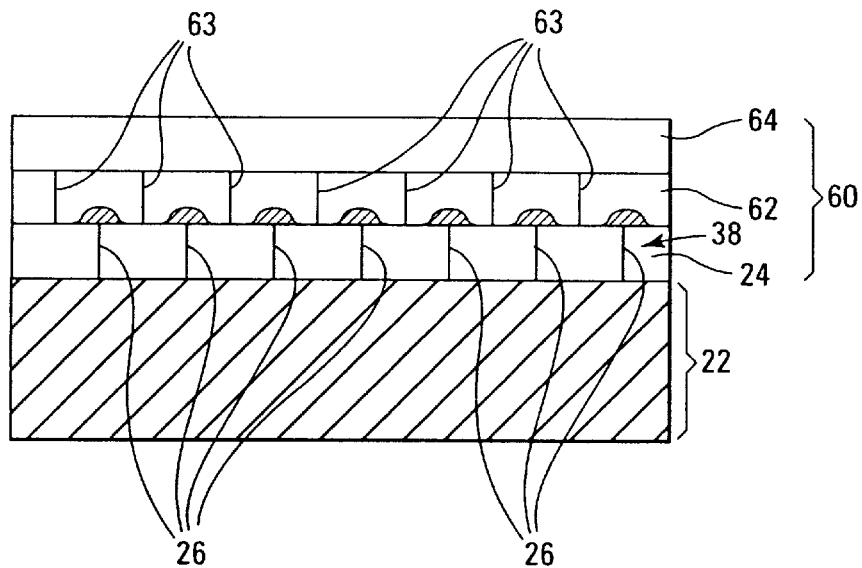
FIG. 3 shows an alternate capacitor structure using the metal/metal oxide composite electrode formed as shown in FIGS. 2A–2D.

In FIG. 3, a capacitor structure 60 shows such a mismatch. The capacitor structure 60 includes the composite platinum-ruthenium oxide composite structure 38 as the bottom electrode with dielectric material 62 and second electrode 64 formed thereover. As shown, grain boundaries 63 of the dielectric material 62 are not aligned with the grain boundaries 26 of the platinum layer 24.

After the high dielectric constant material is deposited, the two scenarios described with reference to FIGS. 2E and 3 may be attained. In other words, either the grain boundaries of the dielectric material match with the grain boundaries 26 of the platinum as illustratively shown in FIG. 2E, or such grain boundaries are mismatched as shown in FIG. 3. However, in both cases, whether matched or mismatched, the bottom composite platinum/ruthenium oxide electrode provides various advantages.

For example, the present invention utilizes the diffusion of oxygen through the grain boundaries 26 of the platinum layer 24 to obtain a composite bottom electrode 38 that includes platinum layer 24 and local ruthenium oxide regions 42 formed on grain boundaries thereof. This composite platinum/ruthenium oxide electrode 38 is an advantageous barrier to oxygen diffusion during high temperature processes in oxidizing atmospheres. For example, during high temperature oxidizing processes, such as those used to form the high dielectric constant material (e.g., a BST deposition process), oxygen diffusion through the grain boundaries 26 of the platinum layer 24 is prevented by having the ruthenium oxide regions 42 on the grain boundaries 26 of the platinum material 24. Such barrier properties are generally important in forming such high dielectric constant materials. Further, the composite platinum/ruthenium oxide electrode also acts as a sink for oxygen vacancies in high permittivity oxide materials. This provides for improved dielectric performance, e.g., improved resistance degradation lifetime or fatigue for ferroelectric oxide dielectrics.

Further, high temperature processing in conjunction with use of platinum may create various problems. For example, a balling out problem, e.g., the formation of islands in the platinum, can sometimes occur. With the use of the ruthenium and silicon nitride layers on top of the platinum material layer 24, such island formation problems can be prevented during high temperature processing. Also, stress in the platinum layer 24, which causes the island formation, can be reduced by having the ruthenium oxide regions 42 formed at the grain boundaries. Such stress relief can be thought of as the ruthenium oxide regions 42 generally gluing the platinum material 24 at the grain boundaries. This enables the platinum material 24 to be a stable bottom electrode for use with high dielectric constant materials.

Yet further, the dielectric properties of the high dielectric constant material 52 can be tailored using the platinum/ruthenium oxide bottom electrode 38. For example, the size of the ruthenium oxide regions 42 can be controlled by the oxidation process used to form such oxide regions 42, e.g., time of oxidation, temperature, ambient, pressure, etc. Further, the unoxidized ruthenium removal process may also be used to control the size of such metal oxide regions or islands, e.g., time of etching, temperature, type of etchant used (such as an etchant that is less selective to ruthenium oxide), etc.

Generally, the size of the ruthenium oxide regions 42 will determine, permittivity, leakage, resistance degradation, fatigue and other properties of the structure. For example, with smaller ruthenium oxide regions 42, less leakage occurs with more platinum at the interface with the high dielectric constant material 52. However, with the use of larger ruthenium oxide regions 42, longer resistance degradation over the lifetime of the structure occurs. Such resistance degradation involves oxygen vacancy migration. For example, ruthenium oxide regions will act as a sink for oxygen vacancies. Further, for example, permittivity can be affected by the texture of the dielectric films which can be affected by the density of the platinum/ruthenium oxide areas. Therefore, generally the process can be optimized to achieve a size of ruthenium oxide regions 42 desired in the capacitor structure 50. As such, the present invention provides flexibility for tailoring the dielectric properties of the high dielectric material 52 in the capacitor structure 50.

Figure 4:
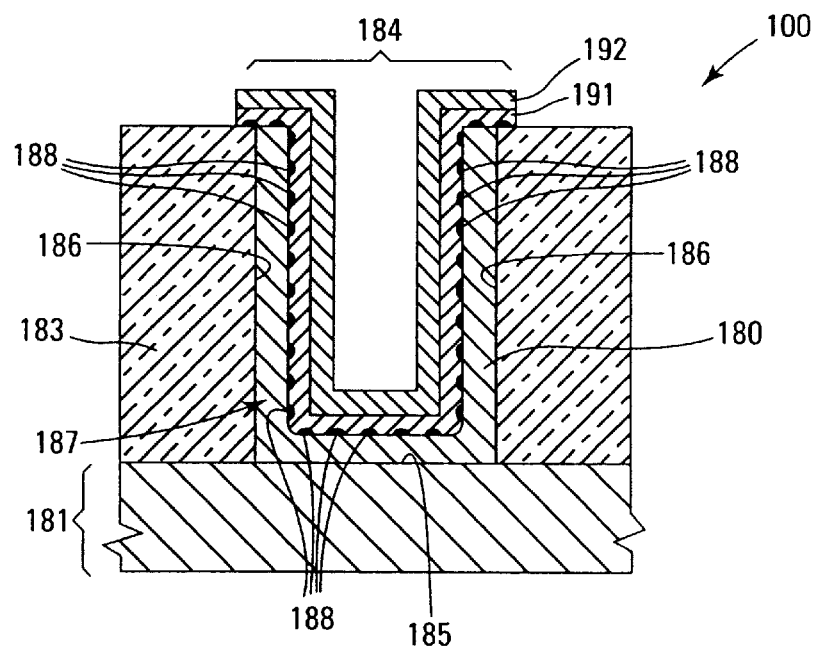
FIG. 4 illustrates the use of a metal/metal oxide composite electrode in a storage cell container capacitor application, e.g., a DRAM storage cell capacitor.

FIG. 4 illustrates the use of a metal/metal oxide composite electrode in a storage cell container capacitor application, e.g., a DRAM storage cell capacitor. In this illustrative application of the present invention, device structure 100 is fabricated according to conventional processing techniques through the formation of an opening 184 prior to depositing a bottom composite electrode structure 187 therein. A bottom electrode 187, including a metal/metal oxide composite structure as previously described herein, is formed in opening 184 according to the present invention.

The substrate assembly 181 may include various elements, such as field oxide regions, active regions, i.e., those regions of a silicon substrate not covered by field oxide, word lines, field effective transistors (FETs), source/drain regions created in the silicon substrate, etc. An insulative layer, e.g., BPSG, of oxide material 183 is formed over the substrate assembly 181. The opening 184 in the insulative layer 183 may be a small high aspect ratio opening. As described herein, small high aspect ratio openings have feature sizes or critical dimensions below about 1 micron (e.g., such as a diameter width of an opening being less than about 1 micron) and aspect ratios greater than about 1. For example, an opening of 1 micron and a depth of 3 microns has an aspect ratio of 3. The present invention is particularly beneficial for forming the bottom electrode 187 in small high aspect ratio features due to the use of CVD or ALD processes for forming conformal platinum and ruthenium layers over step structures.

As shown in FIG. 4, electrode 187, including the composite metal/metal oxide structure as previously described herein, is formed on the one or more side wall surfaces 186 and may also be formed on the bottom surface 185; the surfaces 186 and 185 defining opening 184. For example, the electrode may be formed by planarizing a composite metal/metal oxide material that is formed over the entire structure. As such, the planarization would remove desired regions such that the composite metal/metal oxide material only remains in opening 184 for forming the bottom electrode 187. The electrode 187 includes metal layer 189 and metal oxide regions 188 formed at grain boundaries thereof according to the present invention. Substantially the same processing techniques as described elsewhere herein may be used to form the composite metal/metal oxide structure. For example, the oxidation diffusion barrier layer used to form the metal oxide regions may be formed such that it fills the opening during performance of the process as described previously herein.

Such metal oxide regions 188 may form at the platinum grain boundaries of the platinum adjacent the bottom surface 185 of the substrate assembly 181 even though the substrate assembly 181 may not include oxygen at this location. For example, during deposition of the platinum, an excess amount of oxygen may be incorporated into the platinum as previously mentioned herein. As such, for example, preferential oxidation of ruthenium over the oxidation of the substrate assembly 181, e.g., a silicon containing bottom surface region, may occur to form the ruthenium oxide regions 188 in such regions adjacent the bottom surface 185 during the thermal treatment. Further, this region at the bottom surface 185 is typically very small, e.g., such as in small aspect ratio openings, compared to the other regions, e.g., sidewalls 186, at which the ruthenium oxide will readily form.

Thereafter, dielectric layer 191, e.g., a high dielectric constant material, is formed relative to the electrode 187. Further thereafter, the second electrode 192 is formed relative to the dielectric material 191. For example, such an electrode may be of any conductive material or materials typically used for electrodes. One example of a container capacitor typically including electrodes formed on surfaces requiring conformal formation of a bottom electrode is described in U.S. Pat. No. 5,270,241 to Dennison, et al., entitled "Optimized container stacked capacitor DRAM cell utilizing sacrificial oxide deposition and chemical mechanical polishing," issued Dec. 14, 1993.

All patents, patent documents, and references cited herein are incorporated in their entirety as if each were incorporated separately. This invention has been described with reference to illustrative embodiments and is not meant to be construed in a limiting sense. As described previously, one skilled in the art will recognize that various other illustrative applications may use the techniques as described herein to take advantage of the beneficial characteristics of structures formed thereby. Various modifications of the illustrative embodiments, as well as additional embodiments to the invention, will be apparent to persons skilled in the art upon reference to this description.

What is claimed is:

1. A method for use in fabrication of integrated circuits comprising:
   providing a substrate assembly including an oxygen-containing surface portion;
   forming a first metal layer on at least a portion of the oxygen-containing surface portion;
   forming a second metal layer on at least a portion of the first metal layer;
   providing an oxidation diffusion barrier layer on at least a portion of the second metal layer;
   oxidizing one or more regions of the second metal layer to form metal oxide regions corresponding to one or more grain boundaries of the first metal layer by thermally treating the substrate assembly having the first metal layer, second metal layer, and oxidation diffusion barrier layer formed thereon; and
   removing the oxidation diffusion barrier layer and unoxidized portions of the second metal layer.

2. The method of claim 1, wherein oxidizing one or more regions of the second metal layer comprises annealing the substrate assembly having the first metal layer, second metal layer, and oxidation diffusion barrier layer formed thereon at a temperature greater than 300° C.

3. The method of claim 2, wherein annealing the substrate assembly having the first metal layer, second metal layer, and oxidation diffusion barrier layer formed thereon comprises annealing the substrate assembly having the first metal layer, second metal layer, and oxidation diffusion barrier layer formed thereon in a non-oxidizing atmosphere.

4. The method of claim 1, wherein the first metal layer is formed of at least one metal selected from a group consisting of platinum, palladium, rhodium, and iridium.

5. The method of claim 4, wherein the first metal layer is formed of at least platinum.

6. The method of claim 1, wherein the second metal layer is formed of at least one metal selected from a group consisting of ruthenium, osmium, rhodium, iridium, and cerium.

7. The method of claim 6, wherein the second metal layer is formed of at least ruthenium.

8. The method of claim 1, wherein the oxidation diffusion barrier layer is formed of at least one of silicon nitride, silicon oxynitride, and aluminum oxide.

9. The method of claim 1, wherein removing the unoxidized portions of the second metal layer comprises removing the unoxidized portions of the second metal layer relative to the metal oxide regions using at least one of a wet etch and a dry etch.

10. A method for use in fabrication of integrated circuits comprising:
    providing a substrate assembly including an oxygen-containing surface portion;
    forming a first metal layer on at least a portion of the oxygen-containing surface portion, the first metal layer having grain boundaries extending therethrough;
    forming a second metal layer on at least a portion of the first metal layer; and
    forming metal oxide regions on at least portions of the first metal layer at one or more grain boundaries thereof through selective oxidation of the second metal layer by diffusion of oxygen from the oxygen-containing surface portion through the one or more grain boundaries of the first metal layer.

11. The method of claim 10, wherein forming metal oxide regions on at least portions of the first metal layer at one or more grain boundaries thereof comprises:
    providing an oxidation diffusion barrier layer on at least a portion of the second metal layer;
    thermally treating the substrate assembly having the first metal layer, second metal layer, and oxidation diffusion barrier layer formed thereon to selectively oxidize one or more regions of the second metal layer at the one or more grain boundaries of the first metal layer resulting in the one or more metal oxide regions and unoxidized portions of the second metal layer therebetween; and
    removing the oxidation diffusion barrier layer and the unoxidized portions of the second metal layer.

12. The method of claim 11, wherein thermally treating the substrate assembly having the first metal layer, second metal layer, and oxidation diffusion barrier layer formed thereon comprises annealing the substrate assembly having the first metal layer, second metal layer, and oxidation diffusion barrier layer formed thereon at a temperature greater than 300° C.

13. The method of claim 12, wherein annealing the substrate assembly having the first metal layer, second metal layer, and oxidation diffusion barrier layer formed thereon comprises annealing the substrate assembly having the first metal layer, second metal layer, and oxidation diffusion barrier layer formed thereon in a non-oxidizing atmosphere.

14. The method of claim 11, wherein removing the unoxidized portions of the second metal layer comprises removing the unoxidized portions of the second metal relative to the metal oxide regions using at least one of a wet etch and a dry etch.

15. The method of claim 10, wherein the first metal layer is formed of at least one metal selected from a group consisting of platinum, palladium, rhodium, and iridium.

16. The method of claim 15, wherein the first metal layer is formed of at least platinum.

17. The method of claim 10, wherein the second metal layer is formed of at least one metal selected from a group consisting of ruthenium, osmium, rhodium, iridium, and cerium.

18. The method of claim 17, wherein the second metal layer is formed of at least ruthenium.

19. The method of claim 10, wherein the oxidation diffusion barrier layer is formed of at least one of silicon nitride, silicon oxynitride, and aluminum oxide.

20. A method for use in fabrication of integrated circuits comprising:
    providing a substrate assembly including an oxygen-containing surface portion;
    forming a platinum layer on at least a portion of the oxygen-containing surface portion, the platinum layer having grain boundaries extending therethrough;

forming a ruthenium layer on at least a portion of the platinum layer;

forming ruthenium oxide regions on at least portions of the platinum layer at one or more grain boundaries thereof through selective oxidation of the ruthenium layer by diffusion of oxygen from the oxygen-containing surface portion through the one or more grain boundaries of the platinum layer.

21. The method of claim 20, wherein forming ruthenium oxide regions on at least portions of the platinum layer at one or more grain boundaries thereof comprises:

providing an oxidation diffusion barrier layer on at least a portion of the ruthenium layer;

thermally treating the substrate assembly having the platinum layer, ruthenium layer, and oxidation diffusion barrier layer formed thereon to selectively oxidize one or more regions of the ruthenium layer at the one or more grain boundaries of the platinum layer resulting in the one or more ruthenium oxide regions and unoxidized ruthenium portions of the ruthenium layer therebetween; and removing the oxidation diffusion barrier layer and the unoxidized ruthenium portions of the ruthenium layer.

22. The method of claim 21, wherein thermally treating the substrate assembly having the platinum layer, ruthenium layer, and oxidation diffusion barrier layer formed thereon comprises annealing the substrate assembly having the platinum layer, ruthenium layer, and oxidation diffusion barrier layer formed thereon at a temperature greater than 300° C.

23. The method of claim 22, wherein annealing the substrate assembly having the platinum layer, ruthenium layer, and oxidation diffusion barrier layer formed thereon comprises annealing the substrate assembly having the platinum layer, ruthenium layer, and oxidation diffusion barrier layer formed thereon in a non-oxidizing atmosphere.

24. The method of claim 21, wherein removing the unoxidized ruthenium portions of the ruthenium layer comprises removing the unoxidized ruthenium portions of the ruthenium layer relative to the ruthenium oxide regions using at least one of a wet etch and a dry etch.

25. The method of claim 21, wherein the oxidation diffusion barrier layer is formed of at least one of silicon nitride, silicon oxynitride, and aluminum oxide.

26. The method of claim 21, wherein removing the unoxidized ruthenium portions of the ruthenium layer results in a first electrode of a capacitor structure comprising the first metal layer and the one or more ruthenium oxide regions formed thereon, and further wherein the method comprises:

forming a high dielectric constant material over at least a portion of the first electrode; and forming a second electrode on at least a portion of the high dielectric constant material.

27. A method for use in formation of a capacitor comprising:

providing a substrate assembly including an oxygen-containing surface portion;

forming a first electrode on at least a portion of the oxygen-containing surface portion, wherein forming the first electrode comprises:

forming a first metal layer on at least a portion of the oxygen-containing surface portion, a second metal layer on at least a portion of the first metal layer, providing an oxidation diffusion barrier layer on at least a portion of the second metal layer, oxidizing one or more regions of the second metal layer to form metal oxide regions corresponding to one or more grain boundaries of the first metal layer by thermally treating the substrate assembly having the first metal layer, second metal layer, and oxidation diffusion barrier layer formed thereon, and removing the oxidation diffusion barrier layer and unoxidized portions of the second metal layer;

forming a high dielectric constant material over at least a portion of the first electrode; and forming a second electrode on at least a portion of the high dielectric constant material.

28. The method of claim 27, wherein oxidizing one or more regions of the second metal layer comprises annealing the substrate assembly having the first metal layer, second metal layer, and oxidation diffusion barrier layer formed thereon at a temperature greater than 300° C.

29. The method of claim 28, wherein annealing the substrate assembly having the first metal layer, second metal layer, and oxidation diffusion barrier layer formed thereon comprises annealing the substrate assembly having the first metal layer, second metal layer, and oxidation diffusion barrier layer formed thereon in a non-oxidizing atmosphere.

30. The method of claim 27, wherein the first metal layer is formed of at least one metal selected from a group consisting of platinum, palladium, rhodium, and iridium.

31. The method of claim 30, wherein the first metal layer is formed of at least platinum.

32. The method of claim 27, wherein the second metal layer is formed of at least one metal selected from a group consisting of ruthenium, osmium, rhodium, iridium, and cerium.

33. The method of claim 32, wherein the second metal layer is formed of at least ruthenium.

34. The method of claim 27, wherein the oxidation diffusion barrier layer is formed of at least one of silicon nitride, silicon oxynitride, and aluminum oxide.

35. The method of claim 27, wherein removing the unoxidized portions of the second metal layer comprises removing the unoxidized portions of the second metal relative to the metal oxide regions using at least one of a wet etch and a dry etch.

36. A method for use in formation of a capacitor comprising:

providing a substrate assembly including an oxygen-containing surface portion;

forming a first electrode on at least a portion of the oxygen-containing surface portion, wherein forming the first electrode comprises:

forming a first metal layer on at least a portion of the oxygen-containing surface portion, the first metal layer having grain boundaries extending therethrough, forming a second metal layer on at least a portion of the first metal layer, and forming metal oxide regions on at least portions of the first metal layer at one or more grain boundaries thereof through selective oxidation of the second metal layer by diffusion of oxygen from the oxygen-containing surface portion through the one or more grain boundaries of the first metal layer;

forming a high dielectric constant material over at least a portion of the first electrode; and forming a second electrode on at least a portion of the high dielectric constant material.

37. The method of claim 36, wherein forming metal oxide regions on at least portions of the first metal layer at one or more grain boundaries thereof comprises:

providing an oxidation diffusion barrier layer on at least a portion of the second metal layer;

thermally treating the substrate assembly having the first metal layer, second metal layer, oxidation diffusion barrier layer formed thereon to selectively oxidize one or more regions of the second metal layer at the one or more grain boundaries of the first metal layer resulting in the one or more metal oxide regions and unoxidized portions of the second metal layer therebetween; and removing the oxidation diffusion barrier layer and the unoxidized portions of the second metal layer.

38. The method of claim 37, wherein thermally treating the substrate assembly having the first metal layer, second metal layer, and oxidation diffusion barrier layer comprises annealing the substrate assembly having the first metal layer, second metal layer, and oxidation diffusion barrier layer formed thereon at a temperature greater than 300° C.

39. The method of claim 38, wherein annealing the substrate assembly having the first metal layer, second metal layer, and oxidation diffusion barrier layer formed thereon comprises annealing the substrate assembly having the first metal layer, second metal layer, and oxidation diffusion barrier layer formed thereon in a non-oxidizing atmosphere.

40. The method of claim 37, wherein removing the unoxidized portions of the second metal layer comprises removing the unoxidized portions of the second metal relative to the metal oxide regions using at least one of a wet etch and a dry etch.

41. The method of claim 36, wherein the first metal layer is formed of at least one metal selected from a group consisting of platinum, palladium, rhodium, and iridium.

42. The method of claim 41, wherein the first metal layer is formed of at least platinum.

43. The method of claim 36, wherein the second metal layer is formed of at least one metal selected from a group consisting of ruthenium, osmium, rhodium, iridium, and cerium.

44. The method of claim 43, wherein the second metal layer is formed of at least ruthenium.

45. The method of claim 36, wherein the oxidation diffusion barrier layer is formed of at least one of silicon nitride, silicon oxynitride, and aluminum oxide.

* * * * *